United States Patent
Hulse et al.

(10) Patent No.: US 10,458,716 B2
(45) Date of Patent: Oct. 29, 2019

(54) CONFORMAL THERMAL GROUND PLANES

(71) Applicant: i2C Solutions, LLC, Louisville, CO (US)

(72) Inventors: Michael Hulse, Louisville, CO (US); William Francis, Louisville, CO (US); Yung Cheng Lee, Boulder, CO (US)

(73) Assignees: Roccor, LLC, Longmont, CO (US); The Regents of the University of Colorado, a Body Corporate, Denver, CO (US)

( * ) Notice: Subject to any disclaimer, the term of this patent is extended or adjusted under 35 U.S.C. 154(b) by 509 days.

(21) Appl. No.: 14/532,650

(22) Filed: Nov. 4, 2014

(65) Prior Publication Data

US 2016/0123678 A1 May 5, 2016

(51) Int. Cl.
*F28D 15/02* (2006.01)
*F28D 15/04* (2006.01)
*H01L 23/367* (2006.01)
*B23P 15/26* (2006.01)
*H01L 23/427* (2006.01)

(52) U.S. Cl.
CPC .............. *F28D 15/02* (2013.01); *B23P 15/26* (2013.01); *F28D 15/0233* (2013.01); *F28D 15/04* (2013.01); *H01L 23/3675* (2013.01); *H01L 23/427* (2013.01); *B23P 2700/09* (2013.01)

(58) Field of Classification Search
CPC ...... F28D 15/02; F28D 15/0233; F28D 15/04; H01L 23/3675
See application file for complete search history.

(56) References Cited

U.S. PATENT DOCUMENTS

| 5,343,940 | A | * | 9/1994 | Jean | ..................... | F28D 15/0241 165/104.33 |
|---|---|---|---|---|---|---|
| 6,105,662 | A | * | 8/2000 | Suzuki | ................ | F28D 15/0241 165/104.33 |
| 6,257,328 | B1 | * | 7/2001 | Fujiwara | ................. | F28F 13/00 165/185 |
| 6,446,706 | B1 | * | 9/2002 | Rosenfeld | ........... | F28D 15/0241 165/104.26 |
| 7,663,883 | B2 | * | 2/2010 | Shirakami | ............. | H01L 23/373 165/46 |
| 7,799,428 | B2 | * | 9/2010 | Fujiwara | ................. | G06F 1/203 165/185 |
| 8,069,907 | B2 | | 12/2011 | Bryant | | |

(Continued)

*Primary Examiner* — Jon T. Schermerhorn, Jr.

(74) *Attorney, Agent, or Firm* — Wilson Patent Law, LLC

(57) ABSTRACT

A conformal thermal ground plane is disclosed according to some embodiments along with a method of manufacturing a conformal thermal ground plane according to other embodiments. The method may include forming a first planar containment layer into a first non-planar containment layer having a first non-planar shape; forming a second planar containment layer into a second non-planar containment layer having a second non-planar shape; disposing a liquid cavity and a vapor cavity between the first non-planar containment layer and the second non-planar containment layer; sealing at least a portion of the first non-planar containment layer and at least a portion of the second non-planar containment layer; and charging at least the liquid cavity with a working fluid.

9 Claims, 6 Drawing Sheets

(56) References Cited

U.S. PATENT DOCUMENTS

| | | | |
|---|---|---|---|
| 8,921,702 B1* | 12/2014 | Carter | H05K 1/0204 |
| | | | 165/104.11 |
| 9,374,904 B2 | 6/2016 | Francis | |
| 9,723,753 B2* | 8/2017 | Andres | H01F 27/18 |
| 2005/0039879 A1* | 2/2005 | Hanai | H01L 23/367 |
| | | | 165/46 |
| 2008/0087456 A1 | 4/2008 | Schuette | |
| 2011/0017431 A1 | 1/2011 | Yang | |
| 2014/0268780 A1 | 9/2014 | Wang | |
| 2015/0167951 A1 | 6/2015 | Garelli | |
| 2016/0341486 A1* | 11/2016 | Kim | F28D 15/046 |
| 2016/0365499 A1 | 12/2016 | Francis | |
| 2017/0205150 A1* | 7/2017 | Safford Smith | F28D 15/0233 |
| 2017/0246850 A1 | 8/2017 | Arias | |

\* cited by examiner

CONFORMAL THERMAL GROUND PLANES

GOVERNMENT LICENSE RIGHTS

This invention was made with Government support under Contract HDTRA1-13-P-0008 awarded by the Defense Threat Reduction Agency. The Government has certain rights in the invention.

FIELD

This disclosure relates generally to conformal thermal ground planes.

BACKGROUND

Electronic systems have increased demand for higher power consumption in low volume packages. The resulting increase in heat generation often leads to performance limited by the available thermal management technology rather than the electronic system itself One widely used method of thermal management is the heat pipe, which is simple, reliable, practical, and relatively inexpensive. Heat pipes, however, have thermal transport and geometric limitations. Indeed, among other limitations, heat pipes are generally considered to be a single-dimension solution.

SUMMARY

Embodiments of the invention include a method for manufacturing a conformal thermal ground plane according to some embodiments described herein. The method may include forming a first planar containment layer into a first non-planar containment layer having a first non-planar shape; forming a second planar containment layer into a second non-planar containment layer having a second non-planar shape; disposing a liquid cavity and a vapor cavity between the first non-planar containment layer and the second non-planar containment layer; sealing at least a portion of the first non-planar containment layer and at least a portion of the second non-planar containment layer; evacuating the liquid cavity and the vapor cavity; and charging at least the liquid cavity with a working fluid. In some embodiments, the at least a portion of the first non-planar containment layer and at least a portion of the second non-planar containment layer are sealed together.

A conformal thermal ground plane is also disclosed comprising a first non-planar containment layer; a second non-planar containment layer; a non-planar vapor cavity disposed between the first non-planar containment layer and the second non-planar containment layer; and a non-planar liquid cavity disposed between the first on-planar containment layer and the second non-planar containment layer, the non-planar liquid cavity includes a working fluid at a pressure below ambient pressure.

A conformal thermal ground plane is also disclosed comprising a first non-planar containment layer having at least a first three-dimensional feature formed within the first non-planar containment layer; a second non-planar containment layer having at least a second three-dimensional feature formed within the second non-planar containment layer; a non-planar vapor cavity disposed between the first non-planar containment layer and the second non-planar containment layer having a third three-dimensional feature that is substantially similar to the first three-dimensional feature; and a non-planar liquid cavity disposed between the first non-planar containment layer and the second non-planar containment layer having a fourth three-dimensional feature that is substantially similar to the first three-dimensional feature. In some embodiments, the non-planar liquid cavity includes a working fluid at a pressure below ambient pressure. In some embodiments, the second three-dimensional feature is substantially similar to the first three-dimensional feature.

These illustrative embodiments are mentioned not to limit or define the disclosure, but to provide examples to aid understanding thereof. Additional embodiments are discussed in the Detailed Description, and further description is provided therein. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

Unless otherwise noted, none of the drawings are drawn to scale.

DETAILED DESCRIPTION

Conformal thermal ground planes and methods of manufacturing, forming, and/or creating conformal thermal ground planes are disclosed. Conformal thermal ground planes, for example, may be thermal ground planes that conform to the shape of another device, component, and/or form factor, etc. For example, thermal ground planes utilize phase transformation of an internal working fluid to enable higher effective thermal conductivity than is possible with a single material. In some cases, thermal ground planes can increase thermal conductivity by more than an order of magnitude over conventional techniques. Conformal thermal ground planes may include a thin form with a three-dimensional shape that can allow for devices to be thermally bonded to an external surface rather than on a standard circuit substrate such as fiberglass-reinforced polymer or aluminum boards. Thermal ground planes may also be packaged with a heat-producing device (e.g., batteries, electronics, etc.) to conduct the heat from the heat-producing devices. The high thermal conductivity of a thermal ground plane may allow the heat-producing device to operate at lower temperature, higher power and/or greater efficiency.

Figure 1A:
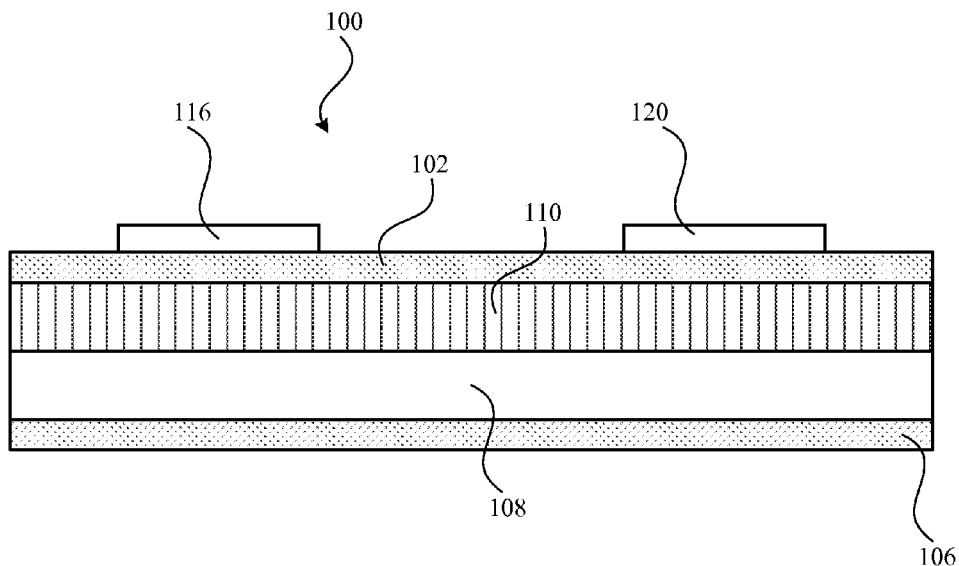
FIG. 1A illustrates a block diagram of a planar thermal ground plane according to some embodiments described herein.

FIG. 1A illustrates a block diagram of a planar thermal ground plane 100 according to some embodiments described herein. The planar thermal ground plane 100 may have a thickness less than about 5, 2.5, 1.0, 0.75, or 0.5 mm. The planar thermal ground plane 100 may include a containment layer 102 and a containment layer 106. The containment layer 102 and the containment layer 106 may enclose a liquid cavity 110 and a vapor cavity 108. As shown in the figure, the planar thermal ground plane 100 does not include any out of plane or non-planar shapes or forms. FIG. 1A also illustrates examples of locations of a heat sink 120 and a heat source 116.

Figure 1B:
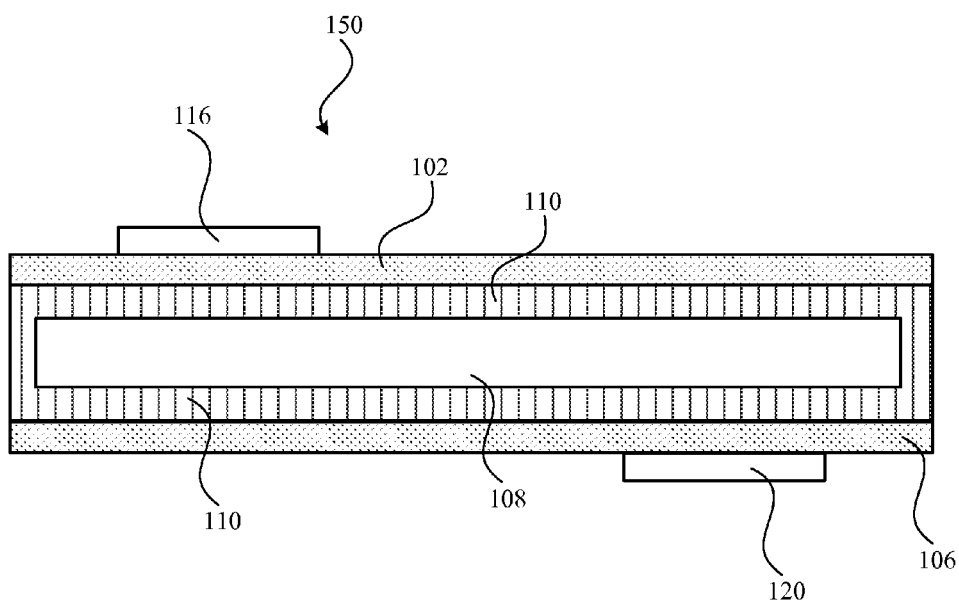
FIG. 1B illustrates a block diagram of another planar thermal ground plane according to some embodiments described herein.

FIG. 1B illustrates a block diagram of another planar thermal ground plane 150 according to some embodiments described herein. The planar thermal ground plane 150 may have a thickness less than about 5, 2.5, 1.0, 0.75, or 0.5 mm. The planar thermal ground plane 150 is similar to the planar thermal ground plane 100 except the liquid cavity 110 is on both sides of the vapor cavity 108. The planar thermal ground plane 150 may also have a heat sink 120 on the containment layer 106 rather than the containment layer 102. The liquid cavity 110 may conduct condensed liquid from the heat sink 120 to a heat source 116.

The planar thermal ground plane 100 and the planar thermal ground plane 150 are not conformal thermal ground planes. Instead, the planar thermal ground plane 100 and the planar thermal ground plane 150 only have the planar shape and do not conform to any specific shape. Moreover, due to the planar nature of the thermal ground planes and the odd geometric shape of a circuit board, it may be difficult to ensure that the heat sources are placed sufficiently close to the containment layer 106 to ensure good thermal coupling to the electrical components as shown in FIG. 2.

Figure 2:
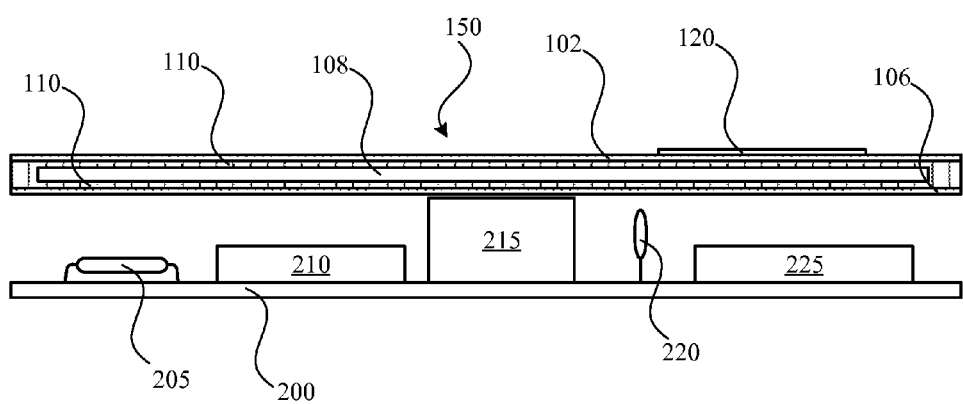
FIG. 2 illustrates an example configuration of a planar thermal ground plane with a circuit board with a number of circuit components: a resistor, a processor, digital memory chips, a capacitor, and/or a battery according to some embodiments described herein.

FIG. 2 illustrates an example configuration of the planar thermal ground plane 150 used in conjunction with a circuit board 200 with a number of circuit components: a resistor 205, a processor 210, memory 215, a capacitor 220, and/or a battery 225. These circuit components and the planar thermal ground plane 150 are not drawn to scale. Various other circuit components may be present on the circuit board 200. Moreover, various other configurations and/or orientations may be considered. To be used most effectively to transport heat from the circuit components such as the processor 210 the containment layer 106 should be positioned as close as possible or in contact with the processor 210 to ensure efficient heat transfer occurs. But, as shown in FIG. 2, the odd sizes and/or shapes of the electrical components of the planar thermal ground plane 100 cannot be positioned near the processor 210.

In some configurations, for example, more than one circuit component such as, for example, the battery 225, may need to be disposed as close as possible or in contact with the containment layer 106. As shown in FIG. 2, however, this may be difficult because of the odd size and/or shape of the circuit components and the planar nature of the planar thermal ground plane 150.

In some other configurations, the planar thermal ground plane 100 or the planar thermal ground plane 150 may need to be kinked at an angle such as, for example, a right angle (or any other angle) in order to provide proper contact between the heat source 116 and the heat sink 120 with the containment layer 102. This may occur based on various housing, component, geometry, and/or housing constraints.

Figure 3:
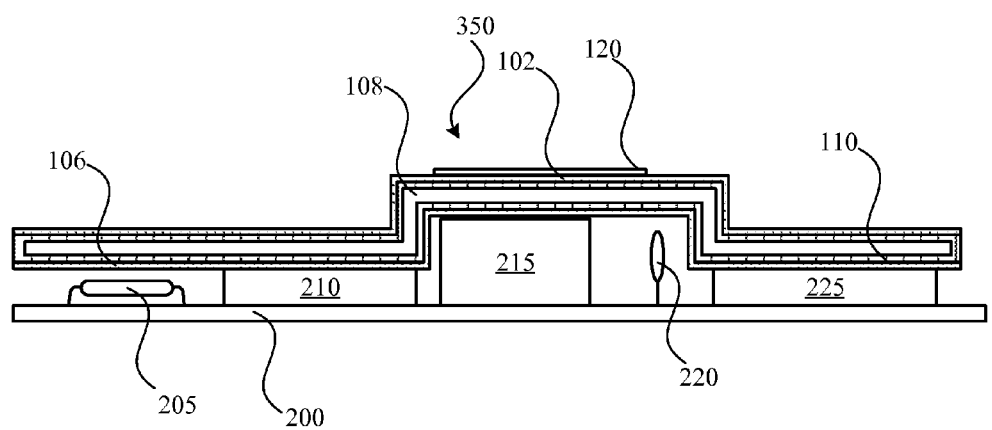
FIG. 3 illustrates an example of a conformal thermal ground plane with a circuit board with a number of circuit components: a resistor, a processor, digital memory chips, a capacitor, and/or a battery according to some embodiments described herein.

Some embodiments described herein may include a conformal thermal ground plane 350 as shown in FIG. 3. The conformal thermal ground plane 350 may include various layers such as, for example, the containment layer 102, the containment layer 106, the vapor cavity 108, and/or the liquid cavity 110, that conform to the shape of the components on the circuit board 200. In this example, the conformal thermal ground plane 100 is in contact with the processor 210, memory 215, and the battery 225. Each of these contact areas can be considered a heat source such that heat may be sourced from these locations and transferred to the heat sink 120 as described above. While FIG. 3 shows the conformal thermal ground plane 350 conforming with circuit components on the circuit board 200, the conformal thermal ground plane 350 may be used in various other devices, systems, and/or configurations.

Figure 4A:
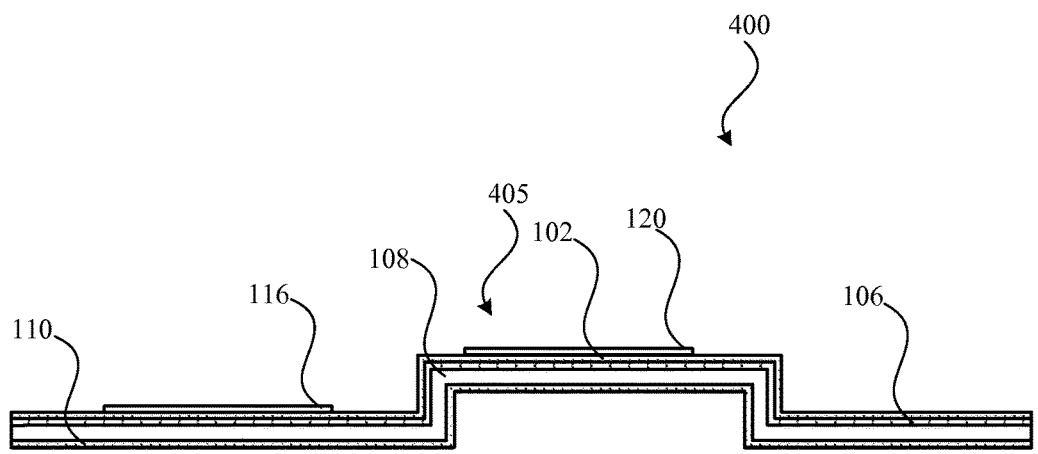
FIG. 4A illustrates a block diagram of a conformal thermal ground plane according to some embodiments described herein.
Figure 4B:
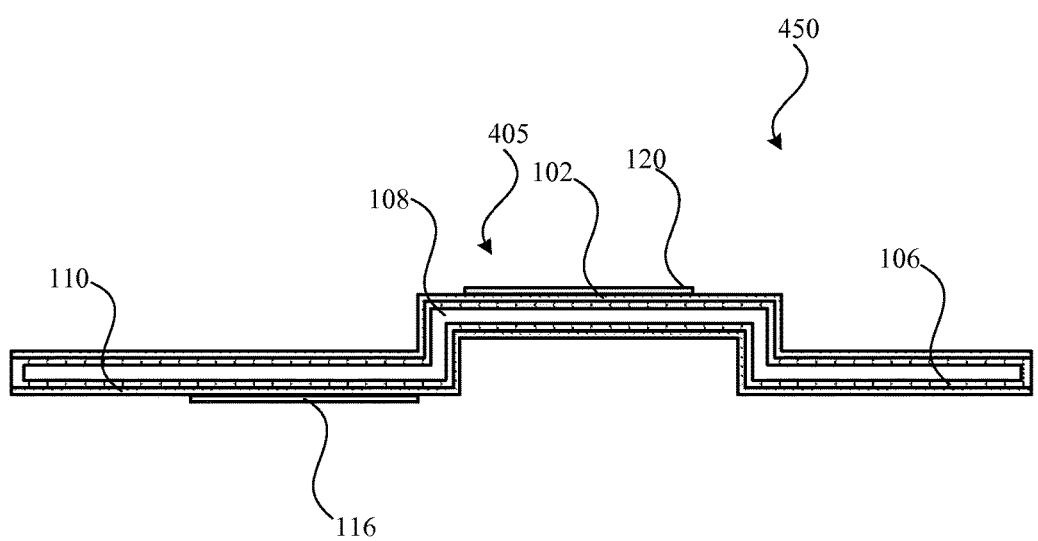
FIG. 4B illustrates a block diagram of another conformal thermal ground plane according to some embodiments described herein.

FIG. 4A illustrates an example conformal thermal ground plane 400 with the heat sink 120 and the heat source 116 disposed on or near the same containment layer 102. FIG. 4B illustrates an example conformal thermal ground plane 450 with the heat sink 120 on or near the containment layer 102 and the heat source 116 disposed on or near the containment layer 106. In some embodiments, either or both the heat sink 120 and the heat source 116 may be external devices, components, elements, etc., and may be in contact with, coupled with, disposed on, disposed near, etc. the containment layer 106 and/or the containment layer 102. The conformal thermal ground plane 400 and/or the conformal thermal ground plane 450 may have a thickness less than about 5, 2.5, 1.0, 0.75, or 0.5 mm.

The conformal thermal ground plane 400 and the conformal thermal ground plane 450 include a three-dimensional feature 405. All the layers making up the conformal thermal ground plane 400 and/or 450 include the three-dimensional feature 405. Moreover, the various layers such as, for example, the containment layer 102, the containment layer 106, the vapor cavity 108, and/or the liquid cavity 110, may be substantially parallel in all portions of the conformal thermal ground plane. Substantially parallel includes layers that are parallel within manufacturing tolerances and/or layers that are designed to be parallel but may have manufacturing or other flaws. Substantially parallel may include layers that appear to be parallel. In some embodiments, the thickness of the liquid cavity 110 and/or the vapor cavity 108 may remain substantially consistent in all portions of the conformal thermal ground plane. For example, a substantially consistent thickness may include a thickness of the liquid cavity 110 and/or the vapor cavity 108 that varies by less than 20%, 18%, 16%, 14%, 12%, 10%, 8%, 6%, 4%, or 2%, etc. along the entire thickness of the liquid cavity 110 and/or the vapor cavity 108.

The containment layer 102 and/or the containment layer 106 may include copper clad Kapton®, titanium, aluminum, copper, metal, composite material, polymer film, Kapton®, Pyralux®, polyimide film, alumina, polyethylene terephthalate (PET), a combination of the above, or any other material. The containment layer 102 and/or the containment layer 106, for example, may have a thickness of less than about 25, 50, 100, 150, 200, 250, 300, 350, 400, 450, and/or 500 microns.

The vapor cavity 108 may include a porous structure (e.g., a three-dimensional porous structure) that resists external pressure while allowing internal vapor transport such that the vapor can easily move away from the heat source and condense at the heat sink. The vapor cavity 108 may include a woven mesh (e.g., a plain woven mesh) with opening sizes, for example, on the order of 0.5 mm and/or a thickness less than 0.5 mm. As another example, the vapor cavity 108 may include a polyether ether ketone (PEEK) material. As yet another example, the vapor cavity 108 may include mesh, foam, fabric, or other porous material made of ceramic, polymer, or metal.

In some embodiments, the liquid cavity 110 may include one or more wicking layers that may wick the condensed working fluid from the heat sink back to the heat source. In some embodiments, the wicking layers may utilize hydrophilic coatings for maximal passive fluid pumping performance. The liquid cavity 110 may include, for example, a mesh or a woven mesh. Moreover, the liquid cavity 110 may also include micro channels etched into the containment layer 102 and/or the containment layer 106. Micro channels, for example, may be about 100 microns deep and 100 microns wide. The liquid cavity 110 may also include a micro porous foam, sintered metal, etc.

In some embodiments, the liquid cavity 110 may include a plurality of pillars (or micro channels) that form a wicking structure on the inner surface of the containment layer 102. The pillars may be made from titanium, copper, aluminum, gold, composite material, nano-structured titania, titanium oxide, titanium, a composite of titanium with other metals such as gold or copper, or other materials either alone or as a composite The pillars may have, for example, a height of about 5-200 microns and a diameter of about 5-500 microns. The spacing between the pillars (i.e., the gap) can be about 1-500 microns. These dimensions of the pillars, e.g., height, diameter, and spacing (or gap), are controlled and optionally varied within the plurality of pillars within the thermal ground plane in order to maximize thermal ground plane performance. For instance, the dimensions can be designed such that viscous losses are minimized and capillary forces are maximized in order to improve thermal ground plane performance. Although the dimensions, or characteristics, of the pillars can vary throughout the thermal ground plane, the characteristics can vary locally within the thermal ground plane or can vary from one pillar to another pillar, as desired for a given application or use of the thermal ground plane. The pillars may form all or part of the vapor cavity 108 and/or the liquid cavity 110.

A heat source, for example, may include an external component that may or may not be coupled with the containment layer 102 and/or the containment layer 106. In some embodiments, the heat source 116 may be manufactured on the containment layer 102 and/or the containment layer 106. As heat is generated by the heat source 116, the containment layer 102 and/or the containment layer 106 and/or a wicking structure transfer the heat to a working fluid disposed within the liquid cavity 110. The working fluid may be any fluid that has a latent heat of vaporization. The working fluid may include water, mercury, sodium, indium, ammonium, acetone, ammonia, alcohol, and/or ethanol. The heat from the heat source 116 is transferred to the fluid, which transforms the fluid from a liquid phase into a vapor phase fluid through evaporation, absorbing the latent heat of vaporization in the process. The evaporation of fluid from the wicking structure creates a region deficient of liquid in the wicking structure. This void of liquid creates a capillary force through surface tension that draws liquid through the wicking structure. The higher vapor pressure created within the vapor cavity 108 near the heat source 116 and the lower vapor pressure within the vapor cavity 108 near the heat sink 120 and allows vapor to be transported within the vapor cavity 108 as a result of a pressure gradient. The vapor condenses and returns to a liquid state, thereby releasing the latent heat of vaporization at the location of condensation near the heat sink 120. The liquid may be transported through the liquid cavity, which may include a wicking structure, from the cooler region near the heat sink 120 towards the hot region near the heat source 116, thereby completing the thermal transport cycle.

In some embodiments, the conformal thermal ground plane 400 and/or the conformal thermal ground plane 450 can be designed to transfer heat out of the planar thermal ground plane 100, e.g., act as a cooling source at one area of the planar thermal ground plane 100. For example, the heat sink 120 can act as a removal area of heat for a device attached in that area, and the heat source 116 can remove the heat transferred through the vapor cavity 108. In essence, the structure can transport thermal energy in either direction, or act as a constant temperature source, for devices attached to the planar thermal ground plane 100.

The thickness of the containment layer 102 can be varied to be thinner at the location of the heat source 116 and thinner at the location of the heat sink 120, and thicker in other regions, which can be used for increased heat transfer, as a mounting location or indicia for the heat source 116, or other reasons, such as increasing structural integrity, as desired for the application of the structure. The varied thicknesses of the containment layer 102 can also facilitate thermal matching by reducing thermally-induced stresses imparted by the containment layer 102 to devices mounted to the thermal ground plane. This relatively small thickness of the containment layer 102 can be supported by thicker beams or pillars that extend from a first containment layer 102 to a second containment layer 106 through the vapor cavity 108, if such support is necessary for the given heat source 116. Further, a larger portion or the entirety of the containment layer 102 can be thinned to any desired thickness to increase thermal transfer, if desired or needed, for a given application of the structure.

In some embodiments, the vapor cavity 108 may span most of or a majority of the lateral dimension of the working portion of the planar thermal ground plane 100 and/or may take any form. In some embodiments, the vapor cavity 108 may have a depth of 10 microns to several meters, with a nominal thickness of 100 microns to several millimeters. In some embodiments, the design of the wicking structure may allow for high mass flow rates of the working fluid to be transported and thereby large amounts of heat to be transported. For example, large height and large spacing of the pillars will reduce viscous losses. In addition, smaller spacing of the pillars or smaller gaps in the mesh may increase capillary forces. Judicious choices of these parameters throughout the planar thermal ground plane 100 will provide optimum performance for a given application of the planar thermal ground plane 100.

In some embodiments, the pillars and/or mesh can be oxidized to form nano-structured titania, which can be used to increase wettability and thereby increase capillary forces, and enhance heat transfer, within the planar thermal ground plane 100. In some embodiments, the pillars may be coated with Silica and/or titania, etc. In some embodiments, the surfaces of various layers, structures and/or components may be coated with Silica and/or titania, etc.

In some embodiments, the vapor cavity and or the liquid cavity may include pillars, a mesh, channels, wires, nanotubes, etc. These may comprise nickel oxide, chromium, chromium oxide, nickel, carbon, titanium, titania, etc.

In some embodiments, the heat source 116 and/or the heat sink 120 may be coupled with the same or opposite sides of the planar thermal ground plane 100. Moreover, the heat source 116 and/or the heat sink 120 may be coupled to the containment layer 102 using any type of coupling such as, for example, solder, thermal adhesive, thermal adhesive glue, thermal adhesive tape, conductive epoxy, thermal paste, etc.

In some embodiments, the planar thermal ground plane 100 may outperform heat pipes and/or vapor chambers. The planar thermal ground plane 100, for example, may have a thermal conductivity of greater than about 1,000 W/m-K, 1,250 W/m-K, 1,500 W/m-K, 1,750 W/m-K, 2,000 W/m-K, 3,000 W/m-K, 4,000 W/m-K, 5,000 W/m-K, 6,000 W/m-K, 7,000 W/m-K, 8,000 W/m-K, 9,000 W/m-K, 10,000 W/m-K, 11,000 W/m-K, 12,000 W/m-K, 13,000 W/m-K, 14,000, etc. It can be noted that the thermal conductivity of solid copper is about 400 W/m-K, and solid aluminum is about 250 W/m-K. In some embodiments, a polymer-based thermal ground plane according to embodiments described herein may have a localized heat flux of greater than 16, 18, 20, 22, 24, or 26 W/cm$^2$, and a metal-based thermal ground plane according to embodiments described herein may have a localized heat flux of greater than 120 W/cm$^2$, 140 W/cm$^2$, 160 W/cm$^2$, 180 W/cm$^2$, etc.

In some embodiments, the planar thermal ground plane 100 may also include a containment layer surrounding the planar thermal ground plane 100 and hermetically sealing the internal volume at a partial vacuum pressure such that the boiling point of the working fluid occurs at the optimal operational temperature.

In some embodiments, the non-planar shape of the conformal al thermal ground plane 350 may be designed to conform to a specific device, circuit board, geometry, etc. In some embodiments, the non-planar shape of the conformal thermal ground plane 350 may be a three-dimensional shape. In some embodiments the non-planar shape of the conformal thermal ground plane 350 may include a standard shape such as, for example, an L-beam shape. In some embodiments, the non-planar shape of the conformal thermal ground plane 350 may include spherical semi-spherical portions. In some embodiments, the non-planar shape of the conformal thermal ground plane 350 may include various bends, kinks, angles, kick-outs, corners,etc. In some embodiments, a conformal thermal ground plane may include a plurality of nonparallel planar surfaces. In some embodiments, a conformal thermal ground plane may include a plurality of three-dimensional shapes yet include a plurality of parallel layers.

In some embodiments, a conformal thermal ground plane is not cylindrical. In some embodiments, a conformal thermal ground plane is not a heat pipe.

Figure 5:
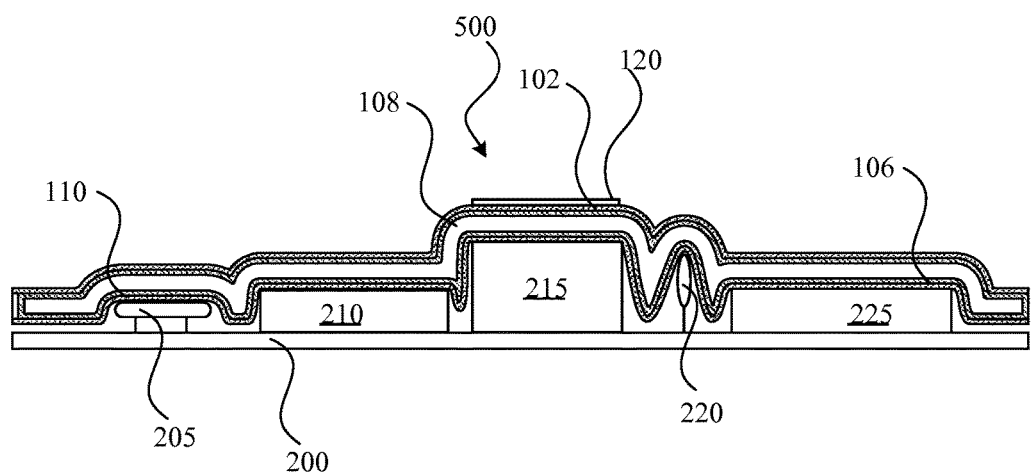
FIG. 5 illustrates an example of a conformal thermal ground plane with a circuit board with a number of circuit components: a resistor, a processor, digital memory chips, a capacitor, and/or a battery according to some embodiments described herein.

FIG. 5 illustrates an example of a conformal thermal ground plane 500 with a circuit board 200 with a number of circuit components: a resistor 205, a processor 210, memory 215, a capacitor 220, and/or a battery 225 according to some embodiments described herein. In this embodiment, conformal thermal ground plane 500 is similar to conformal thermal ground plane 350 and/or may drape over the circuit components (e.g., the resistor 205, the processor 210, the memory 215, the capacitor 220, and/or the battery 225), on the circuit board 200 like a blanket. For example, the thermal ground plane 500 may at least partially conform its shape with the various components upon which it is placed. For example, the thermal ground plane 500 may contact at least a portion of the sides of the various circuit components and/or portions of the circuit board 200.

Figure 6:
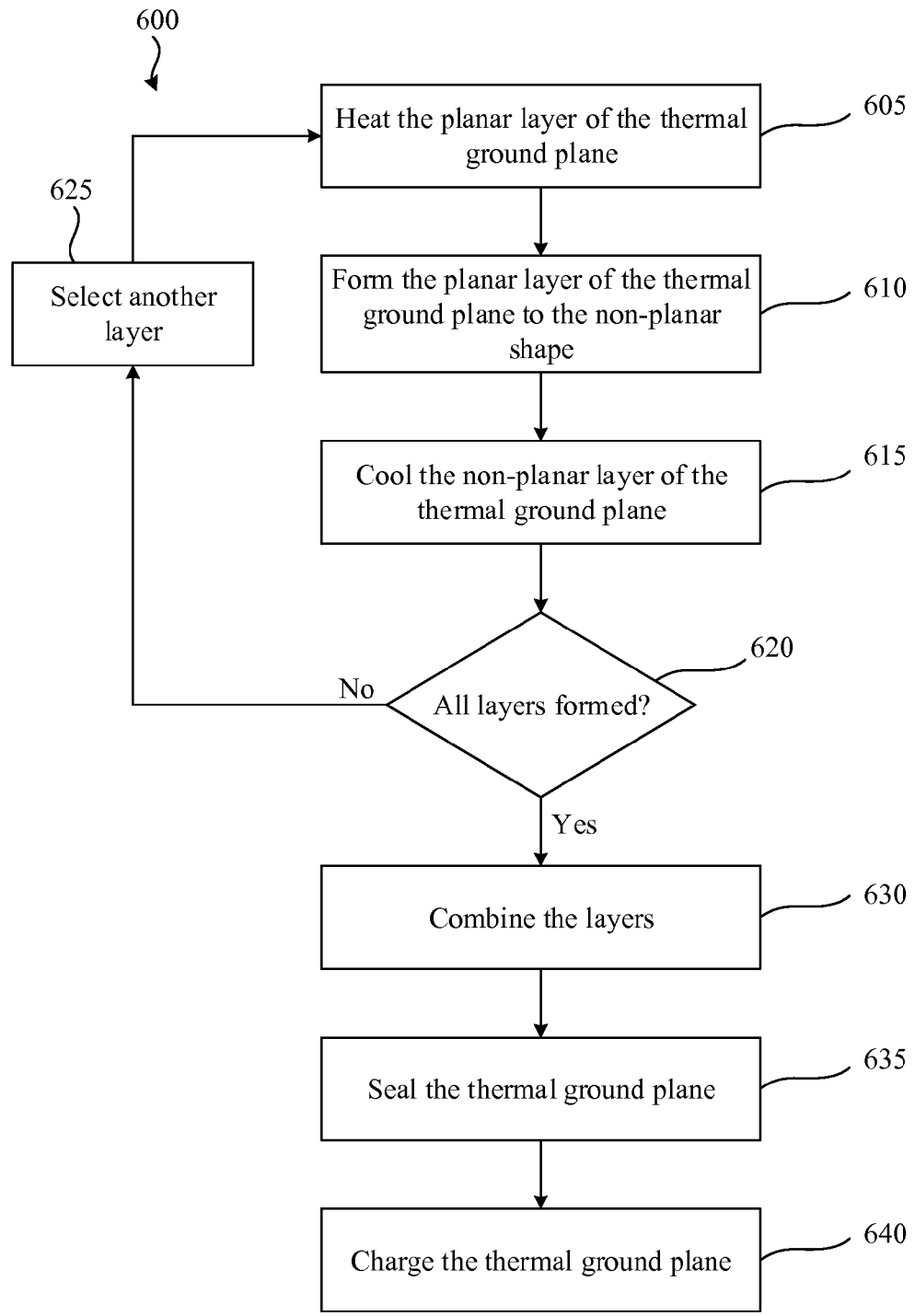
FIG. 6 is a flowchart of an example process of forming a conformal thermal ground plane according to at least one embodiment described herein.

FIG. 6 is a flowchart of an example process 600 of forming a conformal thermal ground plane according to at least one embodiment described herein. Although illustrated as discrete blocks, various blocks may be divided into additional blocks, combined into fewer blocks, or eliminated, depending on the desired implementation. The process 600 may use mechanical deformation techniques such as, for example, die forming, forging, indenting, stretching, recessing, deep drawing, flange forming, bending, and/or shear molding, conformal coating, conformal curing, etc. Various other techniques may be used.

The process 600 begins at block 605 where a planar layer of the thermal ground plane may be heated to a temperature that allows the planar layer to be formed. The temperature of the heating may depend on the material making up the planar layer. And different planar layers may be heated (or not heated) to different temperatures at block 605. The planar layer may be heated to a pliable forming temperature in order, for example, to aid in forming of the conformal ground plane.

At block 610 the layer may be formed into a non-planar shape. The forming may occur using any number of forming techniques. In some embodiments, the layer may be formed into the non-planar shape using mechanical deformation without adding or removing material. Moreover, in some embodiments, the mass of the layer may remain unchanged during forming.

In some embodiments, the planar layer may be formed into the non-planar layer using a die and/or a press. The die may be shaped to match or closely match the configuration of the three-dimensional shape of the component to which the thermal ground plane may be conformed. The die may be pressed into the planar layer to form the layer into the non-planar shape.

In some embodiments, the planar layer may be formed into the non-planar layer using vacuum forming. At block 605 the planar layer may be heated to a forming temperature. The planar layer may then be stretched onto a mold or die. The mold or die may be shaped to match or closely match the configuration of the three-dimensional shape of the component to which the thermal ground plane may be conformed. The planar layer may then be forced against the mold or die through a vacuum as air is sucked from within the die or mold.

At block 615 the non-planar layer may be cooled, if needed.

At block 620, it can be determined whether all the layers have been formed. If all the layers have not been formed then the process 600 proceeds to block 625 and another layer is selected to be formed. If all the layers have been formed then the process 600 proceeds to block 630. For example, block 605, block 610, and/or block 615 may be repeated for each of the following layers: the containment layer 102, the containment layer 106, the vapor cavity 108, and/or the liquid cavity 110, as well as any other layer. Moreover, each of these layers may include more than one sub layer that may be formed individually or collectively.

Some layers, for example, may not need to be heated prior to being formed at block 610. Thus, in some embodiments, block 605 and/or block 610 may be skipped. In some embodiments, block 605, block 610, and/or block 615 may be combined into a single step or performed by a single tool.

For example, various dies and/or molds may heat the planar layer while forming the planar layer into the non-planar layer.

In some embodiments, block 605, block 610, and block 615 may be performed for one layer for a plurality of thermal ground planes prior to being repeated for a different layer for the plurality of thermal ground planes. In some embodiments, a different process may be used in block 605, 610, and/or 615 for different layers.

At block 630 the various non-planar layers may be combined into a conformal thermal ground plane. At block 635 the layers may be hermetically sealed. For example, the exterior edges of the conformal thermal ground plane may be sealed together.

At block 640 the conformal thermal ground plane may be charged with a working fluid. For example, during charging, air may be evacuated out of the conformal thermal ground plane during charging. As another example, the working fluid may be placed within the conformal thermal ground plane during charging. The working fluid may be placed within the conformal thermal ground plane at a pressure above the ambient pressure or in some embodiments below the ambient pressure. As yet another example, the conformal thermal ground plane may be hermetically sealed during charging. The liquid cavity 110 may be evacuated from having any non-condensable gases (possibly at an elevated temperature) and/or adding the working fluid to the liquid cavity and/or the vapor cavity.

FIG. 6 shows a flowchart of the process 600 of forming a conformal thermal ground plane other processes may include stamping of layers or structures or conformal coating of various layers or structure using processes such as, for example, CVD, ALD, MLD, or spray coating to add coatings to or to form layers or structures.

Alternatively and/or additionally, one or more planar layers of may be conformed at the same time and/or in conjunction to one another. For example, one or more layers of a planar thermal ground plane may be placed together and then formed together into a non-planar and/or a three-dimensional shape.

Alternatively or additionally, one or more layers may be shaped into a non-planar shape (e.g., the containment layer 102 and/or the containment layer 106) and one or more other layer (e.g., vapor cavity 108 and/or liquid cavity 110) may be forced into the non-planar shape when the non-planar layers are coupled together. For example, the containment layer 102 and the containment layer 106 may be formed into a non-planar shape and the vapor cavity 108 and/or liquid cavity 110 may comprise a pliable mesh layer or layers. When the containment layer 102 and the containment layer 106 are coupled together, they may force the mesh layer or layers into the non-planar shape.

In some embodiments, the conformal thermal ground plane may be charged by placing frozen working fluid (i.e., the working fluid in the solid phase state) inside the thermal ground plane such as, for example, by placing the frozen working fluid between various layers of the thermal ground plane. Any remaining gases may also be evacuated from the conformal thermal ground plane by introducing it to a vacuum.

The liquid and vapor cavities may have pressure bearing spacer layers such as a coarse mesh.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art.

That which is claimed:

1. A conformal heat pipe system comprising:
    a circuit board;
    a plurality of components on the circuit board, wherein the plurality of components include:
        a first component with at least a first height with respect to the circuit board or a first shape;
        a second component with a second height with respect to the circuit board or a second shape, wherein at least the second height or the second shape is different from at least the first height or the first shape; and
        a third component with at least the second height with respect to the circuit board or the second shape;
    a first conformal containment layer;
    a second conformal containment layer, wherein the first conformal containment layer and the second conformal containment layer each includes a plurality of kinked portions forming a plurality of angled corners such that a first portion of the second conformal containment layer makes contact with the first component with at least the first height or the first shape and a second portion of the second conformal containment layer makes contact with the second component with at least the second height or the second shape and a third portion of the second conformal containment layer makes contact with the third component with at least the second height or the second shape, wherein the plurality of kinked portions include at least four kinked portions that each form 90 degree angles such that at least a first kinked portion from the plurality of kinked portions of the second conformal containment layer and a second kinked portion from the plurality of kinked portions of the second conformal containment layer separate the first portion of the second conformal containment layer and the second portion of the second conformal containment layer and at least a third kinked portion from the plurality of kinked portions of the second conformal containment layer and a fourth kinked portion from the plurality of kinked portions of the second conformal containment layer separate the first portion of the second conformal containment layer and the third portion of the second conformal containment layer;

a conformal vapor cavity disposed between the first conformal containment layer and the second conformal containment layer; and a conformal liquid cavity disposed between the first conformal containment layer and the second conformal containment layer, wherein the conformal liquid cavity includes a working fluid.

2. The conformal heat pipe system according to claim 1, wherein the first conformal containment layer, the second conformal containment layer, the conformal vapor cavity, and the conformal liquid cavity are coupled together as layers or cavities prior to being shaped into respective conformal shapes.

3. The conformal heat pipe system according to claim 1, wherein the conformal liquid cavity comprises a wicking structure.

4. The conformal heat pipe system according to claim 1, wherein the conformal liquid cavity comprises at least one of channels, micro pillars, and a mesh.

5. A conformal heat pipe system comprising:
a circuit board;
a plurality of components on the circuit board, wherein the plurality of components include:
   a first component with at least a first height with respect to the circuit board or a first shape;
   a second component with at least a second height with respect to the circuit board or a second shape, wherein at least the second height or the second shape is different from at least the first height or the first shape; and
   a third component with at least the second height with respect to the circuit board or the second shape;
a first conformal containment layer having at least a first conformal feature formed within the first conformal containment layer;
a second conformal containment layer having at least a second conformal feature formed within the second conformal containment layer, wherein the second conformal feature is similar to the first conformal feature and wherein the first conformal feature and the second conformal feature each includes a plurality of kinked portions forming a plurality of angled corners such that a first portion of the second conformal containment layer makes contact with the first component with at least the first height or the first shape and a second portion of the second conformal containment layer makes contact with the second component with at least the second height or the second shape and a third portion of the second conformal containment layer makes contact with the third component with at least the second height or the second shape, wherein the plurality of kinked portions include at least four kinked portions that each form 90 degree angles such that at least a first kinked portion from the plurality of kinked portions of the second conformal containment layer and a second kinked portion from the plurality of kinked portions of the second conformal containment layer separate the first portion of the second conformal containment layer and the second portion of the second conformal containment layer and at least a third kinked portion from the plurality of kinked portions of the second conformal containment layer and a fourth kinked portion from the plurality of kinked portions of the second conformal containment layer separate the first portion of the second conformal containment layer and the third portion of the second conformal containment layer;

a conformal vapor cavity disposed between the first conformal containment layer and the second conformal containment layer having a third conformal feature that is similar to the first conformal feature; and a conformal liquid cavity disposed between the first conformal containment layer and the second conformal containment layer having a fourth conformal feature that is similar to the first conformal feature, wherein the conformal liquid cavity includes a working fluid.

6. The conformal heat pipe system according to claim 5, wherein the first conformal containment layer and/or the second conformal containment layer have a thickness less than 200 microns.

7. The conformal heat pipe system according to claim 5, wherein the conformal vapor cavity and/or the conformal liquid cavity have a substantially consistent thickness.

8. The conformal heat pipe system according to claim 5, wherein the conformal liquid cavity comprises a wicking structure.

9. The conformal heat pipe system according to claim 5, wherein the conformal liquid cavity comprises at least one of channels, micro pillars, and a mesh.

* * * * *